United States Patent
Arkun et al.

(10) Patent No.: US 8,623,747 B1
(45) Date of Patent: Jan. 7, 2014

(54) SILICON, ALUMINUM OXIDE, ALUMINUM NITRIDE TEMPLATE FOR OPTOELECTRONIC AND POWER DEVICES

(71) Applicants: Erdem Arkun, San Carlos, CA (US); Michael Lebby, Apache Junction, AZ (US); Andrew Clark, Los Altos, CA (US)

(72) Inventors: Erdem Arkun, San Carlos, CA (US); Michael Lebby, Apache Junction, AZ (US); Andrew Clark, Los Altos, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/717,182

(22) Filed: Dec. 17, 2012

(51) Int. Cl.
*H01L 21/20* (2006.01)
*H01L 21/36* (2006.01)

(52) U.S. Cl.
USPC 438/481; 257/94; 257/E21.099; 257/E21.109; 257/E21.113; 438/46; 438/47; 438/479

(58) Field of Classification Search
USPC ............ 257/94, E21.099, E21.109, E21.113; 438/46, 47, 479, 481
See application file for complete search history.

(56) References Cited

U.S. PATENT DOCUMENTS

| | | | |
|---|---|---|---|
| 7,541,258 B2 * | 6/2009 | Hara | 438/424 |
| 7,615,452 B2 * | 11/2009 | Sato | 438/270 |
| 2004/0099918 A1 * | 5/2004 | Noguchi et al. | 257/416 |
| 2010/0096666 A1 * | 4/2010 | Ishida et al. | 257/190 |
| 2010/0288999 A1 * | 11/2010 | Kikuchi et al. | 257/13 |

* cited by examiner

*Primary Examiner* — Robert Huber
(74) *Attorney, Agent, or Firm* — Parsons & Goltry; Robert A. Parsons; Michael W. Goltry

(57) ABSTRACT

A method of forming a template on a silicon substrate includes providing a single crystal silicon substrate. The method further includes forming an aluminum oxide coating on the surface of the silicon substrate, the aluminum oxide being substantially crystal lattice matched to the surface of the silicon substrate and epitaxially depositing a layer of aluminum nitride (AlN) on the aluminum oxide coating substantially crystal lattice matched to the surface of the aluminum nitride.

17 Claims, 3 Drawing Sheets

SILICON, ALUMINUM OXIDE, ALUMINUM NITRIDE TEMPLATE FOR OPTOELECTRONIC AND POWER DEVICES

FIELD OF THE INVENTION

This invention relates in general to the formation of a template for the growth of GaN on a silicon substrate and more specifically to the formation of an aluminum oxide/aluminum nitride template.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. It is also known that during much of the growth process there must ideally be no exposed silicon surface due to detrimental reaction between silicon and the various MBE process gasses, i.e. $N_2$ plasma, $NH_3$ and metallic Ga. Also in the case where other growth processes are used, such as MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors).

It would be highly advantageous, therefore, to remedy the foregoing and other deficiencies inherent in the prior art.

Accordingly, it is an object of the present invention to provide new and improved methods for the formation of an aluminum oxide/aluminum nitride template on a silicon substrate.

It is another object of the present invention to provide new and improved methods for the formation of a template that includes eliminating or greatly reducing the problem of possible damage to the silicon substrate with process gasses.

It is another object of the present invention to provide a new and improved aluminum oxide/aluminum nitride template on a silicon substrate.

It is another object of the present invention to provide new and improved LED and/or HEMT structures on a template on a silicon substrate.

SUMMARY OF THE INVENTION

Briefly, the desired objects and aspects of the instant invention are achieved in accordance with a preferred method of forming a template on a silicon substrate including a step of providing a single crystal silicon substrate. The method further includes forming an aluminum oxide coating on the surface of the silicon substrate, the aluminum oxide being substantially crystal lattice matched to the surface of the silicon substrate and epitaxially depositing a layer of aluminum nitride (AlN) on the aluminum oxide coating substantially crystal lattice matched to the surface of the aluminum nitride.

The method further includes a step of epitaxially depositing a layer of III-N material on the layer of aluminum nitride. Generally, the step of epitaxially depositing a layer of III-N material includes growing an LED structure and/or an HEMT structure on the layer of aluminum nitride.

The desired objects and aspects of the instant invention are achieved in accordance with a specific method of forming a template on a silicon substrate including the step of providing a single crystal silicon substrate. The method further includes the step of forming an aluminum oxide coating on the surface of the silicon substrate with a thickness in a range of approximately 1 nm to approximately 10 nm. The aluminum oxide is substantially crystal lattice matched to the surface of the silicon substrate. Also, the method includes a step of epitaxially depositing a layer of aluminum nitride (AlN) on the aluminum oxide coating, in a range of >0 to approximately 100 nm thick.

The desired objects and aspects of the instant invention are also realized in accordance with a specific crystal lattice matched template on a single crystal silicon substrate. The template includes an aluminum oxide coating on the surface of the silicon substrate, the aluminum oxide being substantially crystal lattice matched to the surface of the silicon substrate. A layer of aluminum nitride (AlN) is epitaxially grown on the aluminum oxide coating and substantially crystal lattice matched to the surface of the aluminum oxide coating.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
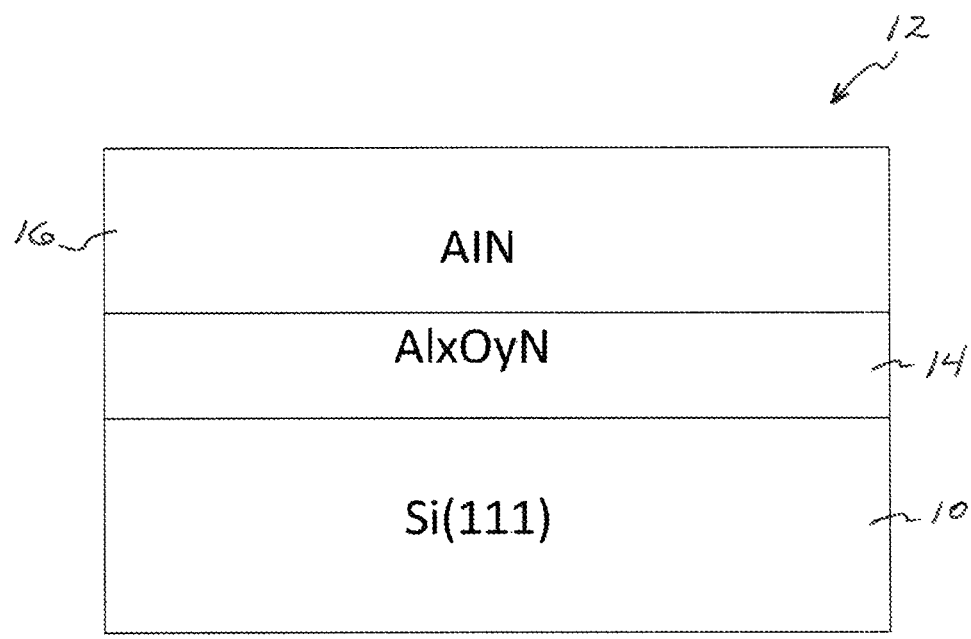
FIG. 1 is a simplified layer diagram of a template on a silicon substrate, in accordance with the present invention.

Turning to FIG. 1, a simplified layer diagram is illustrated representing several steps in a process of forming a template 12 on a silicon substrate 10, in accordance with the present invention. It will be understood that substrate 10 is or may be a standard well known single crystal wafer or portion thereof generally known and used in the semiconductor industry. Single crystal substrates, it will be understood, are not limited to any specific crystal orientation but could include <111> silicon, <110> silicon, <100> silicon or any other orientation or variation known and used in the art. The Si <100> and <111> substrates could also include various miscuts with nominal value between 0 and 10° in any direction.

Silicon substrate 10 is coated with a layer 14 of aluminum oxide formed on the surface thereof. Aluminum oxide layer 14 is grown epitaxially and is mostly single crystal material substantially crystal lattice matched to silicon substrate 10. It will be understood that $Al_2O_3$ is the normal proportion required (stoichiometric) but non-stoichiometric compounds (e.g. $Al_{2-x}O_{3-y}$) may be used in specific applications. Also, aluminum oxide layer 14 may include aluminum oxynitride ($Al_xO_yN$), which is intended to come within the definition of "aluminum oxide" for purposes of this invention.

It should be noted that aluminum oxide is impervious to MBE process gasses, i.e. $N_2$ plasma, $NH_3$ and metallic Ga, which is the preferred growth process in this invention. Also, in the event that other growth processes are used, such as the MOCVD process, the aluminum oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all frowth process gasses by the aluminum oxide coating. Preferably, aluminum oxide layer 14 is in a range of approximately 1 nm to approximately 10 nm thick but for certain applications thicker or thinner films can be grown. Also, aluminum oxide layer 14 can be formed with a single continuous composition or it can be graded, in linear, stepwise or any similar schemes.

A thin aluminum nitride (AlN) layer 16 is epitaxially grown on aluminum oxide layer 14 preferably by an MBE process. Also, in a preferred embodiment layer 16 is in a range of >0 to approximately 100 nm thick. The combination of aluminum oxide layer 14 and aluminum nitride layer 16 results in template 12 for the further growth of III-N materials. Template 12 substantially crystal lattice matches the III-N materials to the silicon substrate and greatly reduces any thermal mismatch. Also, template 12 imparts chemical stability to the process due to the nature of the materials.

Figure 2:
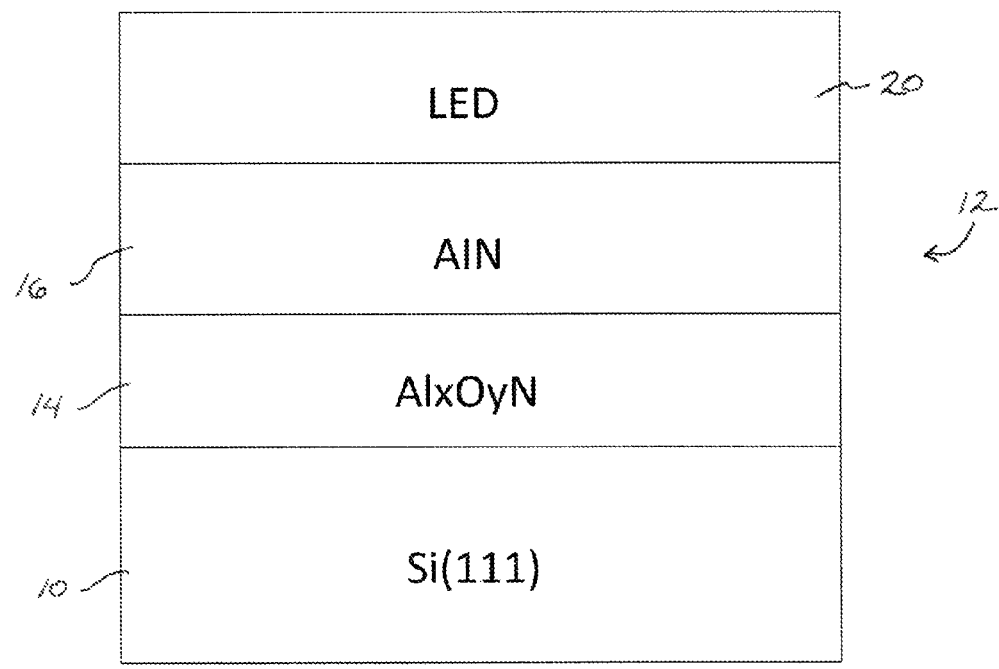
FIG. 2 is a simplified layer diagram of the template of FIG. 1 with an LED structure formed thereon.

Turning to FIG. 2, template 12 is illustrated with a III-N LED structure 20 formed thereon. Structure 20 is illustrated as a single layer for convenience but it should be understood that III-N LED structure 20 includes the growth of one or more typical layers, including for example, i-GaN, n-GaN, active layers such as InGaN/GaN, electron blocking layers, p-GaN, and other inter-layers used in the formation and performance of LED (especially photonic LED) devices.

Figure 3:
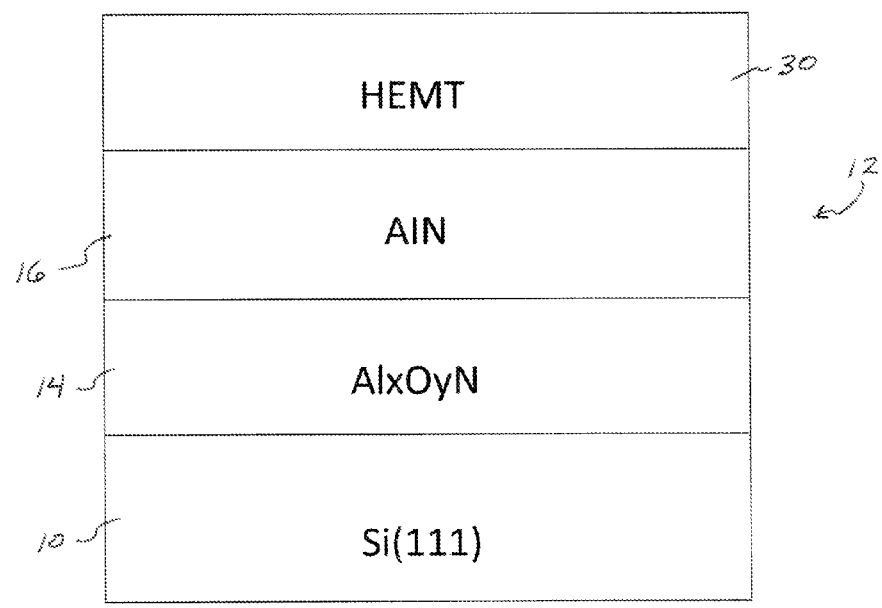
FIG. 3 is a simplified layer diagram of the template of FIG. 1 with an HEMT structure formed thereon.

Turning to FIG. 3, template 12 is illustrated with a HEMT structure 30 formed thereon. Structure 30 is illustrated as a single layer for convenience but it should be understood that HEMT structure 30 includes the growth of one or more typical layers, including for example, i-GaN, AlN, AlGaN, GaN, and other inter-layers used in the formation and performance of HEMT devices.

Thus, new and improved methods for the formation of an aluminum oxide/aluminum nitride template on a silicon substrate are disclosed. The new and improved methods for the formation of the template include eliminating or greatly reducing the problem of possibly damaging the silicon substrate with process gasses. The invention also includes a new and improved aluminum oxide/aluminum nitride template on a silicon substrate. New and improved LED and/or HEMT structures can be substantially lattice matched and thermally matched by the new template on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of forming a template on a silicon substrate comprising the steps of:
   providing a single crystal silicon substrate;
   forming an aluminum oxide coating on the surface of the silicon substrate, the aluminum oxide being substantially crystal lattice matched to the surface of the silicon substrate; and
   epitaxially depositing a layer of aluminum nitride (AlN) on the aluminum oxide coating.

2. A method as claimed in claim 1 wherein the step of forming the aluminum oxide coating includes depositing aluminum oxynitride.

3. A method as claimed in claim 1 wherein the step of forming the aluminum oxide coating includes depositing a layer of aluminum oxide with a thickness in a range of approximately 1 nm to approximately 10 nm thick.

4. A method as claimed in claim 1 wherein the step of forming the aluminum oxide coating includes depositing a layer of aluminum oxide with one of a single continuous composition or a linear or stepwise graded composition.

5. A method as claimed in claim 1 wherein the step of epitaxially depositing the layer of aluminum nitride includes depositing a layer in a range of >0 to approximately 100 nm thick.

6. A method as claimed in claim 1 wherein the step of epitaxially depositing the layer of aluminum nitride includes depositing by an MBE process.

7. A method as claimed in claim 1 further including a step of epitaxially depositing a layer of III-N material on the layer of aluminum nitride.

8. A method as claimed in claim 7 wherein the step of epitaxially depositing the layer of III-N material includes growing an LED structure on the layer of aluminum nitride.

9. A method as claimed in claim 8 wherein the step of growing the LED structure on the layer of aluminum nitride includes growing at least one layer including one of i-GaN, n-GaN, active layers, electron blocking layers, or p-GaN.

10. A method as claimed in claim 7 wherein the step of epitaxially depositing the layer of III-N material includes growing an HEMT structure on the layer of aluminum nitride.

11. A method as claimed in claim 10 wherein the step of growing the HEMT structure on the layer of aluminum nitride includes growing at least one layer including one of, i-GaN, AlN, AlGaN, or GaN.

12. A method of forming a template on a silicon substrate comprising the steps of:
    providing a single crystal silicon substrate;
    forming an aluminum oxide coating on the surface of the silicon substrate with a thickness in a range of approximately 1 nm to approximately 10 nm, the aluminum oxide being substantially crystal lattice matched to the surface of the silicon substrate; and
    epitaxially depositing a layer of aluminum nitride (AlN) on the aluminum oxide coating, in a range of >0 to approximately 100 nm thick.

13. A method as claimed in claim 12 further including a step of epitaxially depositing a layer of III-N material on the layer of aluminum nitride.

14. A method as claimed in claim 13 wherein the step of epitaxially depositing the layer of III-N material includes growing an LED structure on the layer of aluminum nitride.

15. A method as claimed in claim 14 wherein the step of growing the LED structure on the layer of aluminum nitride includes growing at least one layer including one of i-GaN, n-GaN, active layers, electron blocking layers, or p-GaN.

16. A method as claimed in claim 13 wherein the step of epitaxially depositing the layer of III-N material includes growing an HEMT structure on the layer of aluminum nitride.

17. A method as claimed in claim 16 wherein the step of growing the HEMT structure on the layer of aluminum nitride includes growing at least one layer including one of, i-GaN, AlN, AlGaN, or GaN.

\* \* \* \* \*